United States Patent
Ohara

(10) Patent No.: US 7,755,093 B2
(45) Date of Patent: Jul. 13, 2010

(54) SEMICONDUCTOR STORAGE DEVICE AND METHOD OF MANUFACTURING THE SAME

(75) Inventor: Shinji Ohara, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 91 days.

(21) Appl. No.: 11/978,600

(22) Filed: Oct. 30, 2007

(65) Prior Publication Data
US 2008/0105878 A1    May 8, 2008

(30) Foreign Application Priority Data
Nov. 7, 2006    (JP) ............................. 2006-301478

(51) Int. Cl.
H01L 29/04    (2006.01)
(52) U.S. Cl. .......... 257/74; 257/3; 257/5; 257/E21.102; 438/491; 365/158; 365/163
(58) Field of Classification Search ................. 257/3–5, 257/74, 100, E29.003, E21.102
See application file for complete search history.

(56) References Cited

U.S. PATENT DOCUMENTS

| | | | |
|---|---|---|---|
| 7,335,906 B2 * | 2/2008 | Toda | ............................. 257/2 |
| 2003/0174530 A1 | 9/2003 | Tran | |
| 2004/0085833 A1 | 5/2004 | Hwang et al. | |
| 2004/0090809 A1 | 5/2004 | Tran | |
| 2005/0162881 A1 | 7/2005 | Stasiak et al. | |
| 2005/0211978 A1 | 9/2005 | Bu et al. | |
| 2005/0212022 A1 | 9/2005 | Greer et al. | |
| 2006/0102943 A1 | 5/2006 | Ohnishi et al. | |
| 2006/0128129 A1 | 6/2006 | Stasiak et al. | |
| 2006/0197115 A1 | 9/2006 | Toda | |

FOREIGN PATENT DOCUMENTS

| | | |
|---|---|---|
| JP | 2002-530850 | 9/2002 |
| JP | 2003-86768 A | 3/2003 |
| JP | 2004-31914 A | 1/2004 |
| JP | 2004-158852 A | 6/2004 |

(Continued)

OTHER PUBLICATIONS

Japanese Office Action dated Feb. 24, 2009 with English-Language translation.

*Primary Examiner*—Thinh T Nguyen
(74) *Attorney, Agent, or Firm*—McGinn IP Law Group, PLLC

(57) ABSTRACT

A nonvolatile semiconductor storage device is provided in which memory cells comprising PN junction diodes having satisfactory rectifying characteristics are arranged in three dimensions. The semiconductor storage device includes: a first wire which extends in one direction; a second wire which extends in a direction intersecting the first wire; and a memory cell which is positioned at a portion of intersection of the first wire with the second wire between the first wire and the second wire, the memory cell comprising a storage element and a PN junction diode connected thereto, positioned on a side of the second wire used in selecting the memory cell, and a P-type semiconductor forming the PN junction diode forms a portion of the second wire, wherein a plurality of structures, each structure comprising the first wire, the second wire, and the memory cell is provided three-dimensionally.

26 Claims, 9 Drawing Sheets

FOREIGN PATENT DOCUMENTS

| | | |
|---|---|---|
| JP | 2005-217402 A | 8/2005 |
| JP | 2005-307191 A | 11/2005 |
| JP | 2006-511965 | 4/2006 |
| JP | 2006-514440 T | 4/2006 |
| JP | 2006-147694 A | 6/2006 |

* cited by examiner

SEMICONDUCTOR STORAGE DEVICE AND METHOD OF MANUFACTURING THE SAME

BACKGROUND OF THE INVENTION

1. Field of the Invention

The present invention relates to a semiconductor storage device and to a method of manufacturing the same, and in particular relates to a nonvolatile semiconductor storage device in which memory cells, comprising combinations of PN junction diodes and storage elements, are positioned in three dimensions, and to a method of manufacturing the same.

Priority is claimed on Japanese Patent Application No. 2006-301478, filed on Nov. 7, 2006, the contents of which are incorporated herein by reference.

2. Description of the Related Art

In recent years, there has been increasing demand for nonvolatile memory, in which there is no loss of stored data even when power is cut off. Nonvolatile memory includes memory types in which recorded data can be modified any number of times, such as NAND flash memory, and memory types such as mask ROM (Read-Only Memory) in which, once data has been recorded, the data cannot be modified. Memory types such as mask ROM in which data can be recorded only once are generally called OTP (One Time Programmable) type memories.

When manufacturers provide users with digital content such as video data, OTP type memory devices, the contents of which cannot easily be modified, are suitable, and so inexpensive, mass-capacity OTP memory devices are sought.

Mask ROM, which is one type of OTP memory, records data to memory cells arranged in two dimensions in a plane, and so storage capacity cannot easily be expanded (the memory cell density cannot easily be increased) without enlarging chip sizes. Moreover, data is recorded to mask ROMs at the time of chip manufacture, so that unique masks must be prepared for each different data content set to be recorded. For this reason, when only a small quantity of chips is to be manufactured with the same content recorded, efficiency is poor, and such memory is uneconomical.

Apart from mask ROM, as OTP type memory providing large capacities and enabling data recording using electrical signals from an external source after completion of manufacture, memory devices in which memory cells are arranged not only in the plane but also in the chip vertical direction, in a three-dimensional memory cell structure, have been commercialized. Representative cell structures of such memory devices are for example described in Published Japanese Translation of PCT Application No. 2002-530850 and in Published Japanese Translation of PCT Application No. 2006-511965.

FIG. 11 is a perspective view showing a portion (for four bits) of the three-dimensional memory cell structure of a conventional semiconductor storage device.

In FIG. 11, a plurality of conductive wiring layers 801a and 801b are arranged in parallel on dielectric film (not shown) on a semiconductor substrate (not shown). It should be noted that in FIG. 11, only two conductive wiring layers 801a and 801b are shown, but normally, a greater number of conductive wiring layers are arranged in parallel.

Above the conductive wiring layers 801a and 801b is positioned another conductive wiring layer 802, in a direction which perpendicularly intersects the conductive wiring layers 801a and 801b. It should be noted that in FIG. 11, only one conductive wiring layer 802 is shown.

At the intersecting portion of the conductive wiring layer 801a and the conductive wiring layer 802a, a pillar-shape (column-shape) memory cell 810a is provided, so as to connect the conductive wiring layer 801a and the conductive wiring layer 802 in the vertical direction. Similarly at the intersection portion of the conductive wiring layer 801b and the conductive wiring layer 802, a pillar-shape memory cell 810b is provided.

The surroundings of the memory cells 810a and 810b filled with an interlayer dielectric film (not shown). The memory cells 810a and 810b include storage elements capable of holding data in accordance with the magnitude of an electrical resistance value; one memory cell can hold one bit of data.

Other conductive wiring layers 803a and 803b, extending in a direction perpendicularly intersecting the conductive wiring layer 802 (that is, in the same direction as the conductive wiring layers 801a and 801b), are positioned above the conductive wiring layer 802 (only two are shown in FIG. 11). At the portions of intersection of the conductive wiring layers 803a and 803b and the conductive wiring layer 802, pillar-shape memory cells 811a and 811b are positioned so as to connect the conductive wiring layers 803a and 803b with the conductive wiring layer 802 in the vertical direction. The surroundings of the memory cells 811a and 811b are filled with an interlayer dielectric film (not shown) as well.

It is desirable that the materials of each of the above conductive wiring layers have low electrical resistance; hence tungsten (W), or a laminate of tungsten and titanium nitride (TiN), is used.

The number of conductive wiring layers which can be formed in the same plane is limited by the size of the memory chips; hence by stacking the required number of stages of memory cells in the vertical direction, the memory chip storage capacity can be expanded.

FIG. 12 is a vertical cross-sectional view of a pillar-shape memory cell used in a conventional three-dimensional memory cell structure.

This memory cell is configured by stacking, in order, a P-type polysilicon layer 911, doped with boron or a similar impurity; an N-type polysilicon layer 912, doped with phosphorus or a similar impurity; a dielectric film 913, comprising a silicon oxide ($SiO_2$) film, or similar; and an N-type polysilicon layer 914.

After stacking films comprising each of the layers 911 to 914 in order, patterning is performed to obtain a pillar shape (cylindrical shape), so that a memory cell comprising a storage element is formed. This memory cell is connected to the conductive wiring layer 916 below and to the conductive wiring layer 917 above.

In this memory cell, a PN junction diode is formed by the P-type polysilicon layer 911 and the N-type polysilicon layer 912. The action of this PN junction diode is explained below.

Furthermore, an anti-fuse type storage element 915 is formed by the three layers which are the N-type polysilicon layer 912, dielectric film 913, and N-type polysilicon layer 914. In the initial state, because the storage element 915 is provided with a dielectric film 913, there is no conduction between the N-type polysilicon layers 912 and 914. When a voltage is applied across the N-type polysilicon layers 912 and 914, causing breakdown of the dielectric film 913, conduction occurs between the N-type polysilicon layers 912 and 914. Hence by applying a low voltage and judging the presence or absence of a current flowing in the storage element 915, the state (whether conducting or non-conducting) of the storage element 915 can be judged, and the memory cell functions as a memory cell capable of holding one bit of data.

Once the dielectric film 913 is caused to undergo breakdown and enter a conducting state, the original state cannot be restored, and so the cell can be used as an OTP type storage element, recording to which can be performed only once.

Next, action of the storage element 915 provided in a memory cell and the PN junction diode is explained, referring to FIG. 13.

As shown in FIG. 13, other wires B1 and B2 are provided above the wires A1 and A2 of the lowermost layer, intersecting the wires A1 and A2. Furthermore, wires C1 and C2 are provided above wires B1 and B2, intersecting with wires B1 and B2. Memory cells M1 through M6 are positioned between wires A-B and wires B-C. In order to facilitate viewing of the figure, the memory cell positions are shown shifted from the wire intersection portions. Each of the memory cells M1 through M6 has the configuration explained previously using FIG. 12. The PN junction diodes in the memory cells M1 through M6 have the PN junction directions inverted in every other layer. That is, the PN junctions are arranged in directions indicated by the diode circuit symbols in FIG. 13. Specifically, the lower memory cells M2, M4 and M6, connected to the wires B1 and B2, are inverted vertically compared with the memory cell shown in FIG. 12, with the P-type polysilicon layer positioned above, and the storage elements 915 positioned below. The upper memory cells M1, M3 and M5, connected to the wires B1 and B2, are arranged in the same manner as the memory cell in FIG. 12, with the P-type polysilicon layer positioned below.

Focusing on memory cell M1, in order to determine the storage state (conducting state) of the internal storage element, wire B1 is used as a word line and a voltage is applied to memory cell M1, wire C2 connected to the memory cell of interest M1 is selected as a bit line, and by judging whether a current flows in wire C2, the state of memory cell M1 can be determined. At this time, because other memory cells M2, M3, and M4 is also connected to wire B13, depending on the conduction states of the storage elements, currents may flow in these memory cells.

Here, if a PN junction diode is not connected to each of the storage elements, then there exists a path for the flow of current in wire C2 via memory cells M2, M6, and M5. For this reason, the states of elements other than that of the memory cell of interest M1 affect the current flowing in bit line C2, and so the resistance value of the memory cell of interest M1 cannot be correctly judged.

On the other hand, when a PN junction diode is provided in each memory cell as shown in FIG. 13, then due to the PN junction diode of memory cell M6, current attempting to flow in the reverse direction of the PN junction diode is obstructed, and so there is no flow of excess current in wire C2, and the resistance value of the memory cell of interest M1 can be judged correctly.

In order to correctly judge the resistance value of a storage element, and in order to reduce insofar as possible the current flowing during operation, PN junction diodes must be used which have a high capacity for obstructing current flowing in the reverse direction, and which have a satisfactory rectifying characteristic.

In order to form a PN junction diode having satisfactory characteristics using polysilicon layers, it is necessary that, at the junction plane of the N-type polysilicon layer and the P-type polysilicon layer, the N-type impurity and the P-type impurity are distributed with uniform concentrations.

FIG. 14A through FIG. 14C show a method of formation of a PN junction diode and storage element included in a conventional memory cell.

In FIG. 14A, symbol 1101 denotes a cross-section of a conductive wiring layer. The cross-section is cut by a plane which is perpendicular to the extending direction of the conductive wiring layer. A plurality of conductive wiring layers 1101 are positioned in parallel. Dielectric films 1102 fill the spaces between the wiring layers. The surfaces of the dielectric films 1102 are rendered flat by CMP (Chemical-Mechanical Polishing) or another method, and simultaneously the upper surfaces of the wiring layers 1101 are exposed.

Next, as shown in FIG. 14B, an undoped polysilicon film, not containing impurities, is formed over the entire surface, and then an ion implantation method is used to introduce boron or another P-type impurity into this polysilicon film, to form the P-type polysilicon film 1103. The P-type polysilicon film 1103 is formed on a flat surface formed from the conductive wiring layers 1101 and dielectric films 1102, so that a P-type silicon film 1103 into which impurities are uniformly introduced can easily be formed using ion implantation method.

Next, an N-type polysilicon film 1104 into which phosphorus or a similar impurity has been introduced, a silicon oxide ($SiO_2$) film or other dielectric film 1105, and an N-type polysilicon film 1106 are formed in order.

Next, as shown in FIG. 14C, the P-type polysilicon film 1103, N-type polysilicon film 1104, dielectric film 1105, and N-type polysilicon film 1106 are patterned all at once to form pillar shapes (cylindrical shapes), to form memory cells 1107 at prescribed positions of the wiring layers 1101.

In order to render uniform the impurity concentrations in each of the polysilicon films in the memory cells 1107, instead of using an ion implantation method to introduce impurities after forming an undoped polysilicon film, a CVD method may be used to deposit a polysilicon film with impurities introduced using a gas comprising the impurities when depositing the polysilicon film.

However, although the CVD method is normally on ordinary semiconductor device manufacturing lines to deposit polysilicon films containing phosphorus, in general the CVD method is not used to deposit polysilicon films containing boron or other P-type impurities.

For this reason, when depositing a polysilicon film containing P-type impurities, special dedicated deposition equipment must be prepared, and in general very high costs are incurred to introduce such equipment on semiconductor manufacturing lines, so that such methods cannot easily be applied.

Hence in order to form polysilicon film containing P-type impurities at low cost, a method must be employed in which an undoped polysilicon film is first formed, and thereafter ion implantation method is used to introduce the P-type impurities.

However, when the initially formed undoped polysilicon film has irregularities in the surface, or when the undoped polysilicon film is provided only in the base portions of fine contact holes, impurities cannot be introduced uniformly using ion implantation method, and so the polysilicon film must be deposited in a flat state.

Hence in the conventional manufacturing methods, in order to obtain satisfactory diode characteristics at low cost, after forming the P-type polysilicon and N-type polysilicon in a planar state, patterning must finally be performed to process the films into cylindrical (pillar) shapes.

However, as the design rule is reduced and the memory cell shape becomes longer and thinner in the vertical direction compared with the base area, there has been the problem that during cleaning or other wet processes performed during manufacturing, memory cells tend to collapse or are otherwise unstable. Furthermore, when patterning a plurality of stacked layers into cylindrical shapes, due to differences in the etch rates of different films it is difficult to render the side faces as uniform shapes, and there has been the problem that shapes tend to have so-called undercutting. As a result, memory cells tend to collapse even more readily during manufacturing processes, and there have also been adverse effects on memory cell characteristics. For these reasons, reduction of the sizes of conventional memory cells has been difficult, and there has been a limit imposed on integration levels.

Furthermore, in conventional manufacturing methods, memory cell portions must be processed into pillar shapes, and so if films comprising different materials (materials other than polysilicon and silicon oxide film) are stacked to form memory cells, it is still more difficult to process the side face portions without irregularities. In addition, it has been extremely difficult to process materials which are difficult to etch, such as platinum (Pt), to obtain a pillar shape. Hence it has been extremely difficult to use elements other than antifuse type storage elements employing polysilicon as conventional memory cells.

As explained above, in conventional semiconductor storage devices having memory cells in a three-dimensional structure, in order to form PN junction diodes with satisfactory rectifying characteristics, storage element portions, N-type polysilicon, and P-type polysilicon have all been layered on a planar surface, followed by patterning into pillar shapes (cylindrical shapes) so as to function as memory cells. However, during manufacturing processes, memory cell portions have tended to collapse, and fine patterning has been difficult. It has therefore been difficult to raise the density of memory cells arranged per unit area so as to increase the storage capacity of a storage device. Moreover, it has been difficult to perform patterning into pillar shapes of storage elements other than anti-fuse type elements employing polysilicon, for use as memory cells.

SUMMARY OF THE INVENTION

The present invention is made in light of the above circumstances, and an object of the present invention is to provide a nonvolatile semiconductor storage device in which memory cells comprising PN junction diodes having satisfactory rectifying characteristics are arranged in three dimensions, as well as a manufacturing method for such a device.

In order to attain the above object, in the present invention the following configuration is adopted.

A semiconductor storage device in accordance with the present invention comprises: a first wire which extends in one direction; a second wire which extends in a direction intersecting the first wire; and a memory cell which is positioned at a portion of intersection of the first wire with the second wire between the first wire and the second wire, the memory cell comprising a storage element and a PN junction diode that is connected thereto and is positioned on a side of the second wire used in selecting the memory cell, wherein the second wire has a portion of a P-type semiconductor that forms a part of the PN junction diode, and a plurality of structures, each structure comprising the first wire, the second wire, and the memory cell are provided three-dimensionally.

In the semiconductor storage device, the second wire may be a laminated structure of a conducting layer and a P-type semiconductor layer, and the P-type semiconductor layer may form a part of the PN junction diode.

The semiconductor storage device may further comprise: an interlayer dielectric film which is provided between the second wire and the first wire; and a contact hole which is provided at the portion of intersection in the interlayer dielectric film, wherein an N-type semiconductor layer in contact with the P-type semiconductor layers of the second wire may be provided in the contact hole, and the PN junction diode may be formed by the P-type semiconductor layer and the N-type semiconductor layer.

In the semiconductor storage device, the storage element may be an element the resistance value of which is changed by an electrical signal.

In the semiconductor storage device, the storage element may have an insulating material the electrical resistance of which is changed by dielectric breakdown.

In the semiconductor storage device, the storage element may be a material which exhibits a colossal electro-resistance phenomenon.

In the semiconductor storage device, the material exhibiting the colossal electro-resistance phenomenon may be a perovskite metal oxide.

In the semiconductor storage device, the storage element may be a phase-change material which undergoes a phase change upon heating using a current.

In the semiconductor storage device, the storage element may be a tunnel magnetoresistance effect element.

In the semiconductor storage device, the storage element may be connected to the first wire.

In the semiconductor storage device, the first wire may be a bit line, and the second wire may be a word line.

In the semiconductor storage device, the first wire and the second wire may comprise a high-melting point metal layer.

In the semiconductor storage device, the P-type semiconductor layer may comprise a polysilicon layer in which a P-type impurity is diffused, and the N-type semiconductor layer may comprise a polysilicon layer in which an N-type impurity is diffused.

In the semiconductor storage device, a connection portion between the first wire and the memory cell may comprise an N-type silicon plug.

The semiconductor storage device may further comprise: another first wire which is positioned on the side of the second wire opposite from the first wire and extends in the same direction as the first wire; another interlayer dielectric film which is provided between the second wire and the other first wire; and another memory cell which is provided at a portion of intersection of the second wire with the other first wire, wherein a connection portion of the memory cell with the first wire, and a connection portion of the memory cell with the other first wire, may be formed from N-type silicon plugs.

In the semiconductor storage device, the storage element forming the memory cell may be formed from an insulating material the electrical resistance of which is changed by dielectric breakdown, a side face and a bottom face of the contact hole may be covered by the insulating material, and the N-type semiconductor layer may be buried by the insulating material.

In the semiconductor storage device, a storage element forming the other memory cell may be formed from an insulating material the electrical resistance of which is changed by dielectric breakdown, and the insulating material may be formed in a film and may be layered on a surface of the other interlayer dielectric film on the side of the other first wire.

In the semiconductor storage device, a cross-sectional shape of the memory cell may be different from a cross-sectional shape of the other memory cell.

In the semiconductor storage device, a cross-sectional shape of the memory cell and a cross-sectional shape of the other memory cell may be axially symmetric about the second wire.

As describer above, in the semiconductor storage device, the P-type semiconductor forming the PN junction diode of the memory cell is configured as a portion of the second wire, so that the laminated structure of memory cells can be simplified.

Furthermore, the P-type semiconductor layer forming the second wire is the P-type semiconductor of PN junction diode, so that the layered structure of memory cells can be simplified.

Moreover, a PN junction diode is formed by proving a contact hole in an interlayer dielectric film between a second wire and a first wire, and by forming in the contact hole an N-type semiconductor layer in contact with the P-type semiconductor layer of the second wire, so that a PN junction diode with satisfactory rectifying characteristics can be formed.

Moreover, the storage element is an element the resistance value of which changes in accordance with an electrical signal, and so the element can be used as an OTP type memory.

A method of manufacture of a semiconductor storage device in accordance with the present invention comprises: forming a first wire; forming an interlayer dielectric film covering the first wire; providing a contact hole in the interlayer dielectric film, exposing a portion of the first wire; forming a storage element in the contact hole; forming an N-type semiconductor layer on the storage element in the contact hole; forming a P-type semiconductor film covering the N-type semiconductor layer and the interlayer dielectric film; forming a conductive film on the P-type semiconductor film; and patterning the P-type semiconductor film and the conductive film, and forming a second wire intersecting the first wire at the contact hole.

In the method, when forming the conductive film on the P-type semiconductor film, a P-type semiconductor film may be further formed on the conductive film.

In the method, the P-type semiconductor film may be formed by using a CVD method to form a polysilicon film, and performing ion implantation of a P-type impurity into the polysilicon film.

In the method, after forming the N-type semiconductor layer, the N-type semiconductor layer and the interlayer dielectric film may be flattened.

As describer above, in the method of manufacture of the semiconductor storage device, a storage element and an N-type semiconductor layer forming a portion of a PN junction diode are formed by filling them in a contact hole, so that collapse of memory cells during manufacturing processes can be prevented.

Furthermore, the second wire which serve as a word line is formed as a layered member comprising a P-type semiconductor layer and a conductive film, and a PN junction diode is formed from: an N-type semiconductor layer filled in a contact hole provided in an interlayer dielectric film; and the P-type semiconductor layer which form a portion of the second wire, so that PN junction diodes with satisfactory rectifying characteristics can be formed.

Moreover, after using a CVD method to form polysilicon film, a P-type impurity is ion-implanted into the polysilicon film to form a P-type semiconductor film. Therefore, by patterning this film the P-type semiconductor layer can be obtained, so that P-type impurity can be introduced uniformly into the polysilicon film, and PN junction diodes with satisfactory rectifying characteristics can be formed.

In addition, after formation of N-type semiconductor layer, the N-type semiconductor layer and interlayer dielectric film are flattened and then the P-type semiconductor film is formed, so that satisfactory PN junctions can be formed.

Moreover, the storage element may be formed by steps of forming an insulating material.

As explained above, in accordance with the present invention, a nonvolatile semiconductor storage device, in which memory cells comprising PN junction diodes having satisfactory rectifying characteristics are arranged in three dimensions, as well as a manufacturing method for such a device, can be provided.

DETAILED DESCRIPTION OF THE INVENTION

Figure 1:
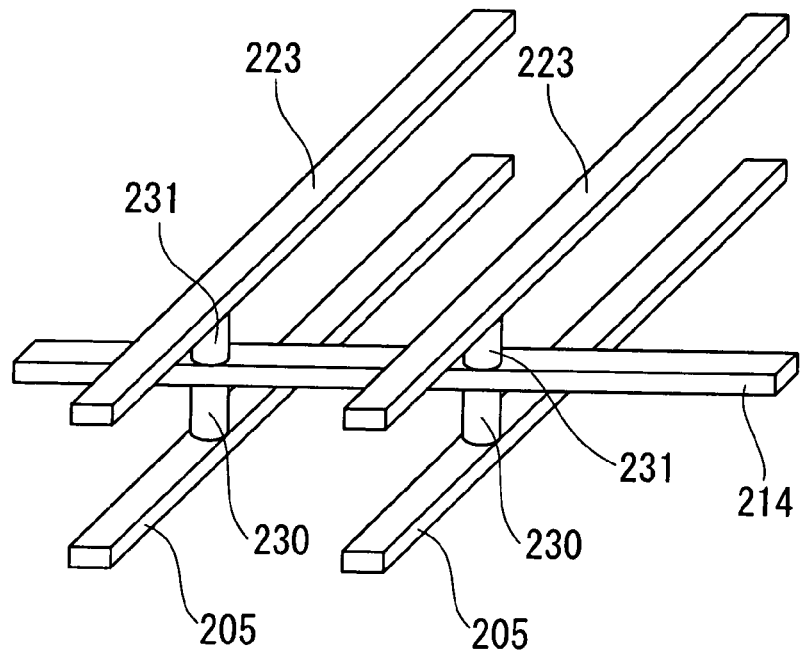
FIG. 1 is a perspective view showing the configuration of a portion of the semiconductor storage device in accordance with a first embodiment of the present invention.

Hereinbelow, embodiments of the present invention are explained referring to the drawings. The figures referenced in the following explanations are provided to explain semiconductor storage devices and manufacturing methods thereof; the sizes, thicknesses, other dimensions and similar of the portions shown may be different from those of actual semiconductor storage devices.

First Embodiment

Figure 2:
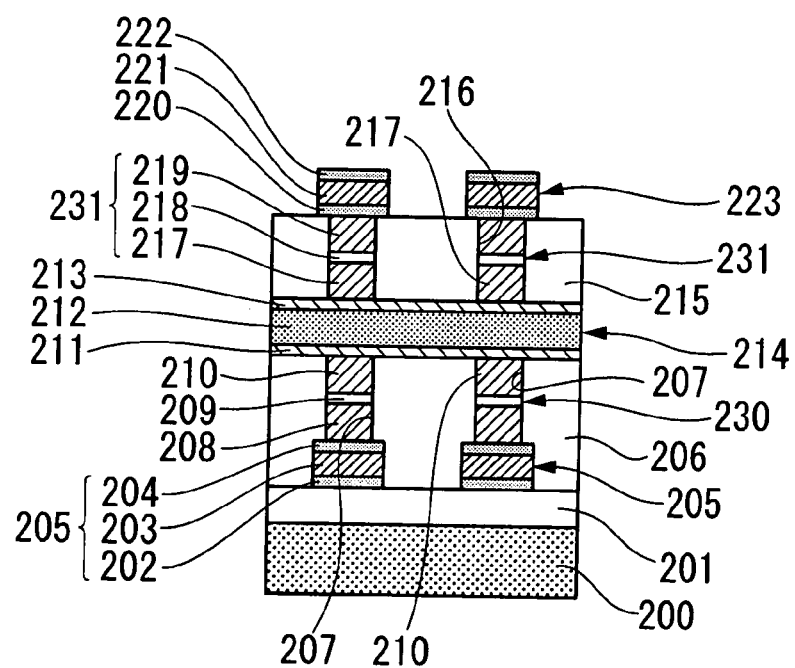
FIG. 2 is a schematic cross-sectional view showing principal portions of the semiconductor storage device in accordance with the first embodiment of the present invention.

Hereinbelow, a first embodiment is explained referring to FIG. 1 through FIG. 5B. FIG. 1 is a perspective view showing the configuration of a portion of the semiconductor storage device in accordance with the present embodiment. FIG. 2 is a schematic cross-sectional view showing principal portions of the semiconductor storage device in accordance with the present embodiment. FIG. 3A through FIG. 5B are process diagrams explaining a method of manufacture of the semiconductor storage device shown in FIG. 1 and FIG. 2.

As shown in FIG. 1, the semiconductor storage device of the present embodiment is mainly configured from first wires 205 extending in one direction, second wires 214 extending in a direction intersecting the first wires 205, and memory cells 230 provided in contact holes positioned at each portion of intersection of first wires 205 and second wires 214, so as to connect the first wires 205 and second wires 214.

On the opposite side of the second wires 214 from the first wires, other first wires 223 extend in the same direction as the first wires 205. Other memory cells 231 are positioned at each of the portions of intersection of the second wires 214 and the first wires 223. Above the first wires 223 are provided other second wires, not shown. In this way, the semiconductor storage device of the present embodiment has a three-dimensional structure, in which first wires and second wires are layered repeatedly in alternation, and memory cells are positioned at each of the portions of intersection of the wires.

In FIG. 1, two first wires 205 are shown; normally, however, a greater number of first wires are arranged in parallel. Similarly, in FIG. 1 only one second wire 214 is shown, but normally a greater number of second wires are arranged in parallel. The first wires 205, 223 are bit lines used to judge the storage states of memory cells, and the second wire 214 is a word line used to select memory cells.

On the surroundings of each of the memory cells 230 and 231 are provided interlayer dielectric films, described below. Furthermore, each of the memory cells 230 and 231 includes a PN junction diode and a storage element capable of holding data by means of an electrical resistance magnitude; one memory cell can hold one bit of data.

In FIG. 2, a silicon oxide or other dielectric film 201 is layered on a semiconductor substrate 200 comprising single-crystal silicon. On the surface of the semiconductor substrate 200, circuitry necessary for data input to and output from the memory cells 230, 231 is formed using MOS (Metal Oxide Semiconductor) transistors, or similar.

On the dielectric film 201 are arranged a plurality of first wires 205, in parallel and with prescribed intervals therebetween, to serve as bit lines. The first wires 205 are formed by layering a TiN layer 202, a layer 203 of a metal such as W with a high melting point, and a TiN layer 204.

On a portion of the first wires 205 and on the dielectric film 201 is layered an interlayer dielectric film 206, comprising silicon oxide or similar. Contact holes 207 are provided in the interlayer dielectric film 206, in positions above the first wires 205; by filling the interiors of these contact holes 207, memory cells 230 are formed so as to fill the respective contact holes 207, and the lower-end sides of these memory cells 230 are connected to the first wires 205.

Above the interlayer dielectric film 206 and memory cells 230, second wires 214, to serve as word lines, are arranged in parallel with prescribed intervals therebetween. The second wires 214 are formed by layering a P-type semiconductor layer 211, a layer 212 of a metal such as W with a high melting point, and a P-type semiconductor layer 213. The P-type semiconductor layer 211 of the second wires 214 is connected to the memory cells 230.

On a portion of the second wires 214 and on the interlayer dielectric film 206 is layered another interlayer dielectric film 215, comprising silicon oxide or similar. Contact holes 216 are provided in the interlayer dielectric film 215, in positions above the second wires 214. Memory cells 231 are formed so as to fill the interiors of these contact holes 216, and the lower-ends of these memory cells 231 are connected to the second wires 214.

Furthermore, above the interlayer dielectric film 215 and memory cells 231, a plurality of other first wires 223, to serve as bit lines, are arranged in parallel with prescribed intervals therebetween. These first wires 223, similarly to the previous first wires 205, are formed by layering a TiN layer 220, a layer 221 of a metal such as W with a high melting point, and a TiN layer 222. The first wires 223 are connected to the upper-ends of the memory cells 231.

Next, N-type semiconductor layers 208, dielectric films 209 of an insulating material, and N-type semiconductor layers 210 are layered in order in the contact holes 207. The N-type semiconductor layers 210 form junctions with the P-type semiconductor layers 211 which form the second wires 214, to form the PN junctions of the memory cells 230. In this way, the PN junction diodes of the memory cells 230 are formed by the N-type semiconductor layers 210 and the P-type semiconductor layers 211 of the second wires 214. Thus in the present embodiment, the P-type semiconductors forming the PN junction diodes are the P-type semiconductor layers 211 forming the second wires 214. The action of the PN junction diodes is explained below.

Furthermore, anti-fuse type storage elements, which are elements the resistance value of which changes due to an electrical signal, are formed by N-type semiconductor layers 208, dielectric films 209, and N-type semiconductor layers 210. In the initial state, the storage elements are provided with dielectric films 209, so that there is a non-conducting state between the N-type semiconductor layers 208 and 210. By applying a voltage across the N-type semiconductor layers 208 and 210 and causing breakdown of the dielectric film 209, a conducting state results between the N-type semiconductor layers 208 and 210. Hence by applying a low voltage and judging whether current flows in the storage element, the state of the storage element (whether conducting or non-conducting) can be judged, and so the storage element can function as a memory cell capable of holding one bit of data. That is, in order to judge the storage state of the storage element, after the word line 214 and bit line 205 are selected, a low voltage, of magnitude which does not cause changes to the state of the storage element, is applied to the word line 214, and the magnitude of the current which flows is judged.

Because once the dielectric film 209 has been caused to undergo breakdown and enters a conducting state, the original state cannot be restored, the device can function as an OTP type storage element, to which recording can be performed only once.

Similarly, N-type semiconductor layers 217, dielectric films 218 comprising an insulating material, and N-type semiconductor layers 219 are layered in order in the contact holes 216 provided in the interlayer dielectric film 215. The N-type semiconductor layers 217 are in contact with the P-type semiconductor layers 213 forming the second wires 214, and form PN junctions. In this way, PN junction diodes are formed by the N-type semiconductor layers 217 and P-type semiconductor layers 213. In the present embodiment, the P-type semiconductor forming the PN junction diodes is the P-type semiconductor layer 213 of the second wires 214.

Furthermore, similarly to the above explanation, anti-fuse type storage elements are formed by the three layers which are the N-type semiconductor layers 217, dielectric films 218, and N-type semiconductor layers 219. In order to judge the storage states of these storage elements, after selecting a word line 214 and a bit line 223, a low voltage, of magnitude such that the state of the storage element is not changed, is applied to the word line 214, and the magnitude of the current flowing is detected.

In FIG. 1, only the memory cells for four bits are shown; but in addition to arranging similar memory cells in the plane, by stacking memory cells repeatedly in the vertical direction, the number of memory cells can be increased, and the desired storage capacity can be obtained.

In the above-described semiconductor storage device, the P-type semiconductor layers 211 and 213 are formed from polysilicon layers in which P-type impurities have been diffused. The N-type semiconductor layers 208, 210, 217, and 219 are formed from polysilicon layers in which N-type impurities have been diffused (N-type silicon plugs).

In the semiconductor storage device of the present embodiment, the cross-sectional shapes of the memory cells 230 and of the other memory cells 231 are axially symmetric with respect to the second wires 214; but the cross-sectional shapes of the memory cells 230 and 231 may be different.

Next, a method of manufacture of the above-described semiconductor storage device is explained, referring to FIG. 3A through FIG. 5B.

Figure 3A:
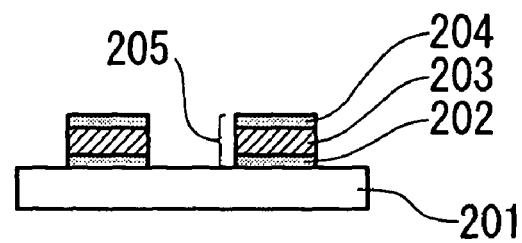
FIG. 3A through FIG. 3D, FIG. 4A through FIG. 4D, and FIG. 5A through FIG. 5B are process diagrams explaining a method of manufacture of the semiconductor storage device shown in FIG. 1 and FIG. 2.

First, as shown in FIG. 3A, a dielectric film 201 is formed, comprising a silicon oxide ($SiO_2$) film or similar, on a semiconductor substrate (not shown). Next, a three-layer film, comprising a TiN layer 202, a layer 203 of a high-melting point metal such as tungsten (W) or similar, and a TiN layer 204, is formed in order, after which patterning is performed to form first wires 205 which are bit lines.

Figure 3B:
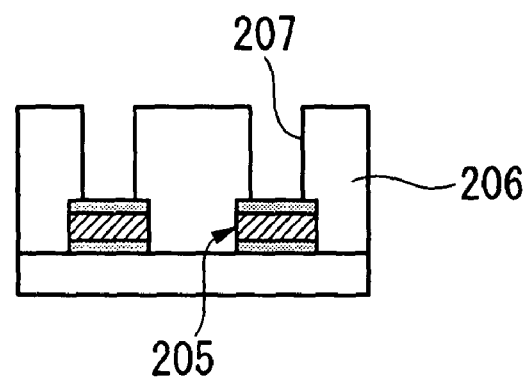

Next, as shown in FIG. 3B, an interlayer dielectric film 206, comprising silicon oxide or similar, is formed, and the CMP method or another method is used to flatten the surface. Then, contact holes 207 are opened in each of the memory cell formation regions in the first wires 205.

Figure 3C:
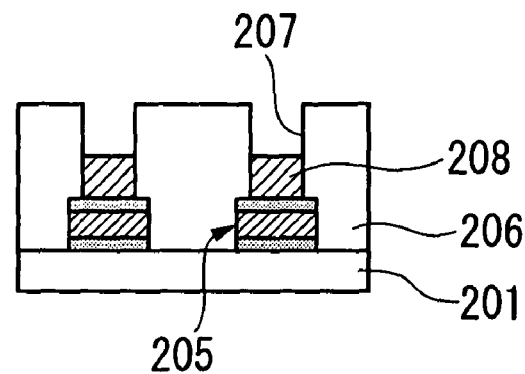

Next, as shown in FIG. 3C, the CVD method is used to form N-type semiconductor layers 208, comprising N-type polysilicon layers containing phosphorus (an N-type impurity), so as to completely fill the interior of the contact holes 207. Etching of the entire surface is performed, so that the N-type semiconductor layers 208 are left only in the vicinity of the base portions of the contact holes 207.

Figure 3D:
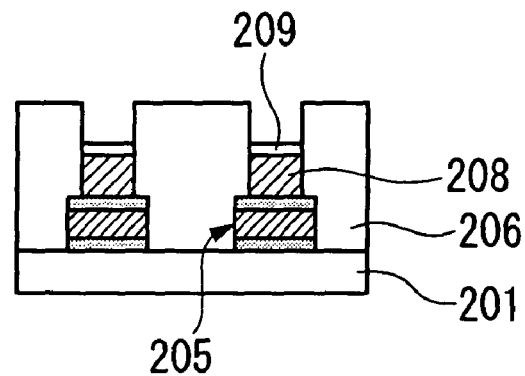

Next, as shown in FIG. 3D, a dielectric film 209, of film thickness 3 to 10 nm, is formed using a silicon oxide film on the N-type semiconductor layers 208. When forming the dielectric film 209, thermal oxidation may be performed to convert the upper portion of the N-type semiconductor layers 208 into silicon oxide film, or the film may be formed by a CVD method.

When using thermal oxidation, in order to prevent oxidation of the wiring layer which is the layer below the N-type semiconductor layers 208, a structure may be employed in which a film of silicon nitride ($Si_3N_4$) or similar, which does not allow penetration of oxygen, is provided as an intermediate layer of the previously formed interlayer dielectric film 206. Moreover, when using the CVD method, silicon oxide film adheres to the side face portions of the contact holes 207 also, so that the aperture dimension of the contact holes 207 is reduced somewhat; but because the dielectric film 209 is thin, this poses no problem in particular.

Figure 4A:
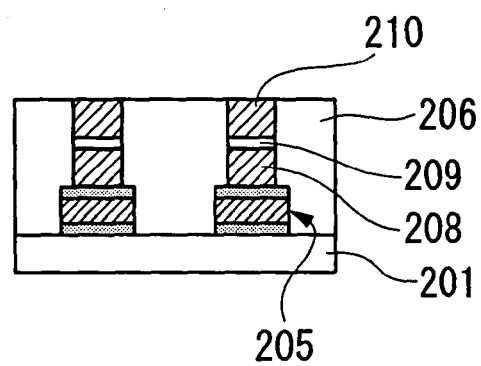

Next, as shown in FIG. 4A, the CVD method is used to form N-type semiconductor layers 210, comprising N-type polysilicon containing phosphorus (an N-type impurity), so as to fill the contact holes 207 above the dielectric films 209. Thereafter, CMP or a similar method is used to flatten the surface. Because the CVD method is used to introduce phosphorus during deposition of the N-type semiconductor layers 210, layers are obtained in which phosphorus is uniformly contained in the polysilicon.

A portion filling a contact hole 207 comprising the three layers which are an N-type semiconductor layer 208, a dielectric film 209, and an N-type semiconductor layer 210 operates as a storage element. That is, in the initial state immediately after manufacture, a dielectric film 209 exists, so that there is a non-conducting state between the N-type semiconductor layers 208 and 210. By applying an appropriate voltage from outside across the N-type semiconductor layers 208 and 210, the dielectric film 209 enters a breakdown state, and a conducting state between the N-type semiconductor layers 208 and 210 results. Hence data can be stored corresponding to the state of the storage element, non-conducting or conducting. As the dielectric film 209, in addition to a silicon oxide film, a silicon nitride film, tantalum oxide ($Ta_2O_5$) film, or other dielectric film can be used. The applied voltage necessary to induce the breakdown state can be set appropriately through the type of dielectric film 209 and the thickness of the film formed.

Figure 4B:
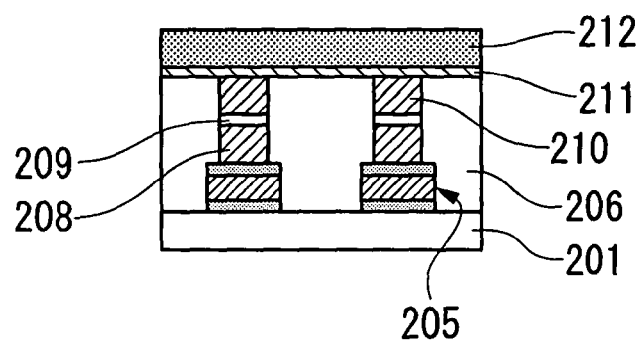

Next, as shown in FIG. 4B, after forming undoped polysilicon over the entire surface so as to make contact with the N-type semiconductor layers 210, ion implantation method is used to introduce boron or another P-type impurity into the polysilicon, to form a P-type semiconductor layer 211 comprising P-type polysilicon. At this time, the surface of the interlayer dielectric film 206 and N-type semiconductor layers 210 is flattened by the previous CMP treatment, and so ion implantation can be used to form a P-type semiconductor layer 211 comprising P-type polysilicon in which impurities are uniformly included.

Thereafter, a layer 212 of tungsten or another high-melting point metal is formed on the P-type semiconductor layer 211.

Figure 4C:
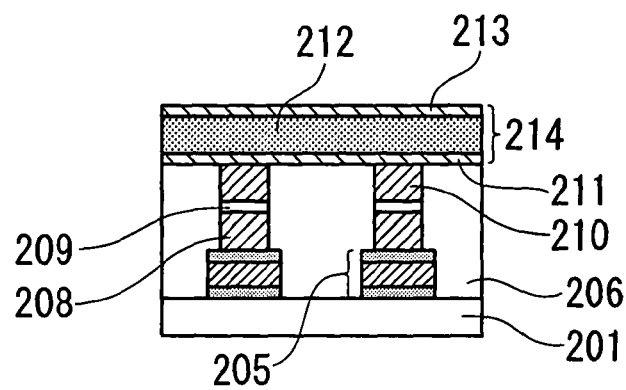

Next, as shown in FIG. 4C, undoped polysilicon is formed over the entire surface of the high-melting point metal layer 212, after which ion implantation method is used to introduce boron or another P-type impurity into the polysilicon, to form a P-type semiconductor layer 213 comprising P-type polysilicon. At this time, the underlying high-melting point metal layer 212 and P-type semiconductor layer 211 have not yet been patterned, so that the surface remains flat. Hence using ion implantation, a P-type semiconductor layer 213 can be formed comprising P-type polysilicon in which impurities are uniformly included.

Next, by using a photoresist film to pattern the three-layer film comprising the P-type semiconductor layer 211, high-melting point metal layer 212, and P-type semiconductor layer 213, second wires 214 which serve as word lines are formed. The second wires 214 are patterned so as to extend in the direction perpendicularly intersecting the first wires 205 which are the bit lines. By causing the N-type semiconductor layers 210 and P-type semiconductor layers 211 to be in contact, PN junction diodes are formed.

Figure 4D:
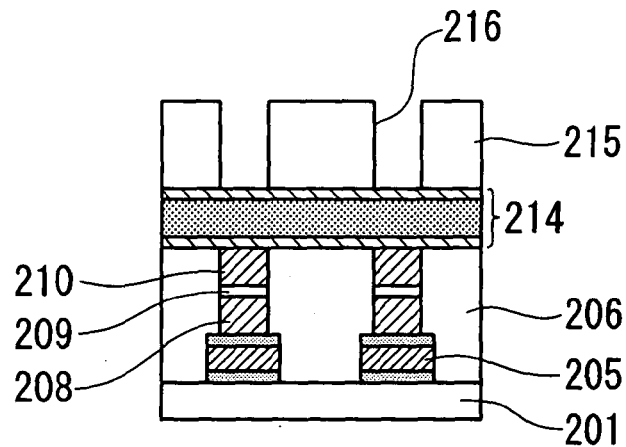

Next, as shown in FIG. 4D, an interlayer dielectric film 215 comprising a silicon oxide film or similar is formed on the second wires 214, after which CMP or similar method is used to flatten the surface. Then, contact holes 216 are opened in each of the memory cell formation regions over the second wires 214.

Figure 5A:
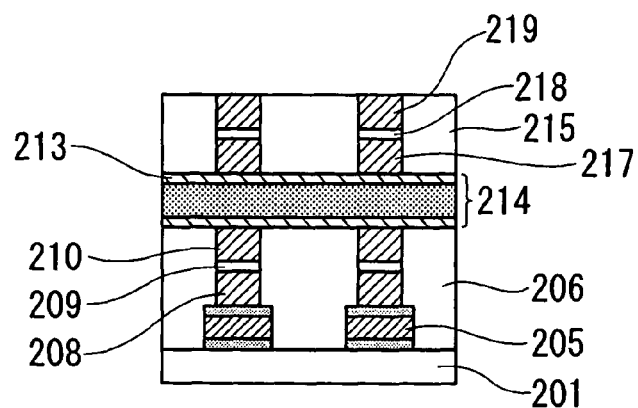

Next, as shown in FIG. 5A, N-type semiconductor layers 217, dielectric films 218, and N-type semiconductor layers 219 are formed in the contact holes 216, similarly to the processes described previously, and CMP or another method is used to flatten the surface. The three layers filling a contact hole 216 which are an N-type semiconductor layer 217, dielectric film 218, and N-type semiconductor layer 219 operate as a storage element.

Furthermore, by bringing the P-type semiconductor layer 213 provided as the layer above the second wires 214 into contact with the N-type semiconductor layers 217 within the contact holes 216, PN junction diodes are formed.

Figure 5B:
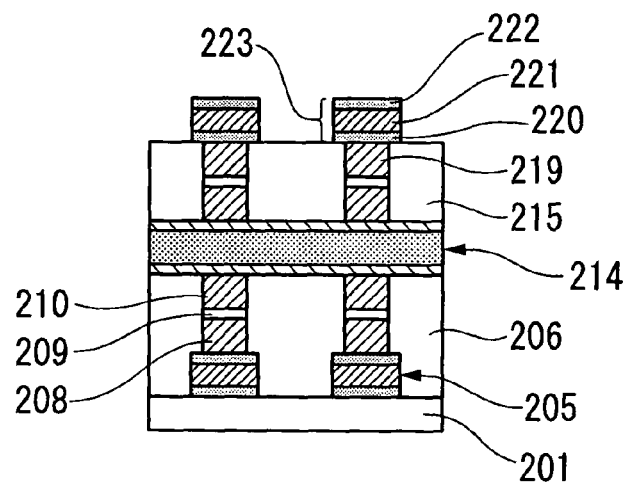

Next, as shown in FIG. 5B, after forming a three-layer film comprising a TiN layer 220, a layer 221 of tungsten or another high-melting point metal, and a TiN layer 222, so as to be in contact with the N-type semiconductor layers 219, patterning is performed to form first wires 223 which serve as bit lines.

Subsequently, by repeating the above-described processes, the necessary number of layers of bit lines, storage elements, and word lines are added.

In order to improve the characteristics of the PN junction diodes formed using polysilicon, during manufacturing processes annealing may be performed at appropriate times in a high-temperature nitrogen atmosphere of 750 degrees Celsius or higher.

An example has been described in which tungsten is used as the wires forming word lines and bit lines; however, an alloy containing tungsten, as well as another high-melting point metal film, such as for example films of iridium (Ir), osmium (Os), chromium (Cr), zirconium (Zr), tantalum (Ta), titanium (Ti), vanadium (V), molybdenum (Mo), rhodium (Rh), nickel (Ni), ruthenium (Ru), and similar, or alloys of these, can also be used.

Moreover, the first wires 205 and 223 serving as bit lines have a layered structure of TiN and a high-melting point metal layer; but instead of TiN, nitride compounds containing tungsten, cobalt, tantalum or similar, such as WN, CoN, TaN and similar, can also be used. In addition, a high-melting point metal single-layer structure can also be used, without any consequences for the essence of the present invention.

Furthermore, the N-type semiconductor layers 208 and 219 in contact with the respective first wires 205 and 223 serving as bit lines can also be replaced with high-melting point metals, such as for example tungsten or similar.

With respect to the semiconductor substrate 200 of FIG. 2, SOI (Silicon On Insulator) type substrates, or substrates not employing silicon as the main component, can also be used.

In the above-described semiconductor storage device, second wires 214 serving as word lines have a three-layer structure, comprising a P-type semiconductor layer 211 of P-type polysilicon as the lower layer, a high-melting point metal layer 212 as the intermediate layer, and a P-type semiconductor layer 213 of P-type polysilicon as the upper layer; and PN junction diodes are formed by the N-type semiconductor layers 210 and 217 filling contact holes 207 and 216 adjacent to word lines, and P-type semiconductor layers 211 and 213 of the word lines 214. As a result, PN junction diodes with satisfactory rectifying characteristics can be formed.

Moreover, in the method of manufacture of semiconductor storage devices of the present embodiment, instead of simultaneously forming the PN junction diodes and storage elements of the three-dimensional memory cells 230, 231 into cylindrical shapes (pillar shapes), by filling contact holes 207 and 216 with a portion thereof, memory cell collapse during manufacturing processes is avoided, and memory cells can be manufactured with high densities. As a result, device scales can be reduced based on application of finer design rules than in the conventional art, and storage capacities can be increased.

Furthermore, by employing a three-layer structure for the second wires 214 which are word lines, and by forming PN junction diodes from the N-type semiconductor layers 210 and 217 filled in contact holes 207 and 216 adjacent to word lines and the P-type semiconductor layers 211 and 213 forming word lines 214, the functions of PN junction diodes with the satisfactory rectifying characteristics required for manufacture of three-dimensional memory cells can be realized inexpensively, using only existing manufacturing equipment.

Second Embodiment

Figure 6:
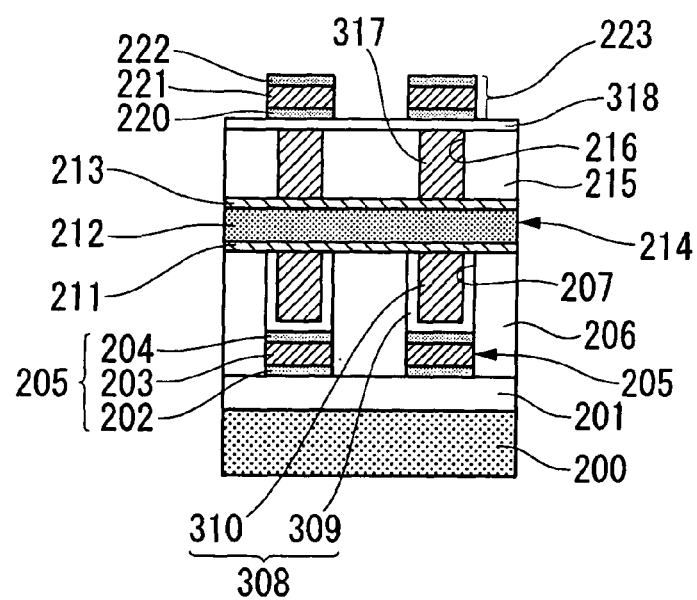
FIG. 6 is a schematic cross-sectional view showing principal portions of the semiconductor storage device in accordance with a second embodiment of the present invention.

Next, a second embodiment is explained, referring to FIG. 6 and to FIG. 7A through FIG. 7D. FIG. 6 is a schematic cross-sectional view showing principal portions of the semiconductor storage device in accordance with the present embodiment. FIG. 7A through FIG. 7D are process diagrams used to explain the method of manufacture of the semiconductor storage device shown in FIG. 6. Of the configuration shown in FIG. 6 through FIG. 7D, portions which are the same as in the configurations shown in FIG. 1 through FIG. 5B are assigned the same symbols, and explanations thereof are omitted.

As shown in FIG. 6, the circuitry necessary for input and output of data to and from memory cells 308 is formed on a semiconductor substrate 200 using MOS type transistors and similar. Furthermore, dielectric film comprising silicon oxide film or similar is formed on the semiconductor substrate 200, and the first wires 205 serving as bit lines are formed on the dielectric film 201; above the first wires 205 are formed second wires 214, and above the second wires are formed other first wires 223. An interlayer dielectric film 206 is formed between the first wires 205 and second wires 214, and another interlayer dielectric film 215 is formed between the second wires 214 and first wires 223.

In the interlayer dielectric film 206, contact holes 207 are opened at the portions of intersection of the first wires 205 and second wires 214, to serve as regions for formation of memory cells 308. A dielectric layer 309, comprising a silicon oxide film or similar, is provided to a film thickness such that the contact holes 207 are not filled, in order to cover the side face and base of the contact holes 207. N-type semiconductor layers 310 of an N-type polysilicon are formed in portions surrounded by the dielectric layer 309, in structures which completely fill the contact holes 207. The N-type semiconductor layers 310 are in contact with the P-type semiconductor layers 211 of the second wires 214 serving as word lines, to form PN junction diodes.

The N-type semiconductor layers 310 form storage elements through contact with the first wires 205 which serve as bit lines, with dielectric layers 309 intervening. That is, in the initial state immediately after manufacture, there is a non-conducting state between the N-type semiconductor layers 310 and the first wires 205; but upon applying a voltage from outside and causing breakdown of the dielectric layers 309, the state changes to a conducting state.

In the interlayer dielectric film 215, contact holes 216, to become memory cell formation regions, are opened at the portions of intersection of the second wires 214 and first wires 223. The contact holes 216 are completely filled with N-type semiconductor layers 317 of N-type polysilicon. The N-type semiconductor layers 317 make contact with the P-type semiconductor layers 213 which are the upper layers in second wires 214 serving as word lines, to form PN junction diodes.

A dielectric layer 318 of silicon oxide or similar is formed on the N-type semiconductor layers 317 and interlayer dielectric film 215 (on the surface of the interlayer dielectric film 215 on the side of the first wires 223). The N-type semiconductor layers 317 make contact with the first wires 223, with the dielectric layer 318 intervening, to form storage elements. That is, in the initial state immediately after manufacture, there is a non-conducting state between the N-type semiconductor layers 317 and the first wires 223; but upon applying a voltage from outside and causing breakdown of the dielectric layer 318, the state changes to a conducting state.

Next, a method of manufacture of a semiconductor storage device of the present embodiment is explained, referring to FIG. 7A through FIG. 7D.

Figure 7A:
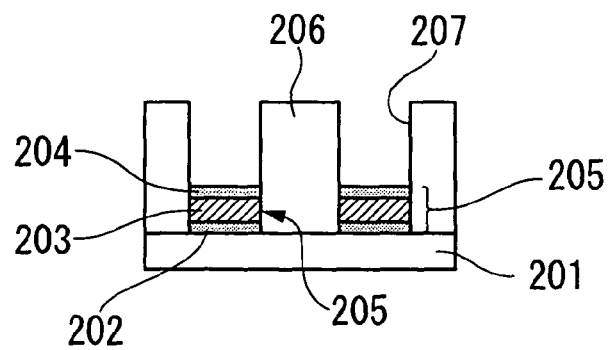
FIG. 7A through FIG. 7D are process diagrams explaining a method of manufacture of the semiconductor storage device shown in FIG. 6.

As shown in FIG. 7A, first wires 205, serving as bit lines, are first formed on a semiconductor substrate (not shown), with a dielectric film 201 intervening. An interlayer dielectric film 206 is formed on the first wires 205, and after flattening the surface, contact holes 207 are formed, exposing portions of the first wires 205.

Figure 7B:
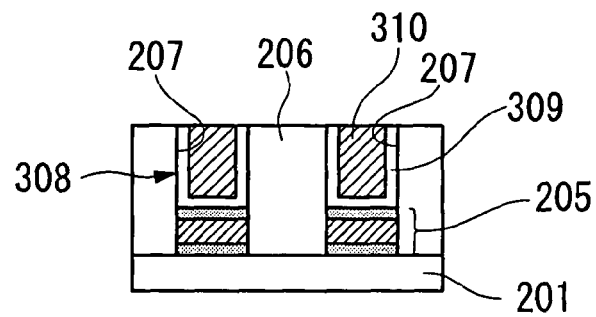

Next, as shown in FIG. 7B, the CVD method is used to form a dielectric layer 309 of silicon oxide or similar to a thickness of approximately 3 to 10 nm, so as not to completely fill the contact holes 207, after which N-type semiconductor layers 310 are formed to completely fill the contact holes 207. Similarly to the first embodiment, the N-type semiconductor layers 310 are formed by the CVD method using N-type polysilicon containing phosphorus (an N-type impurity).

Then, CMP or another method is used to remove the N-type polysilicon formed on the interlayer dielectric film 206, leaving only semiconductor layers 310 of N-type polysilicon in the contact holes 207.

Figure 7C:
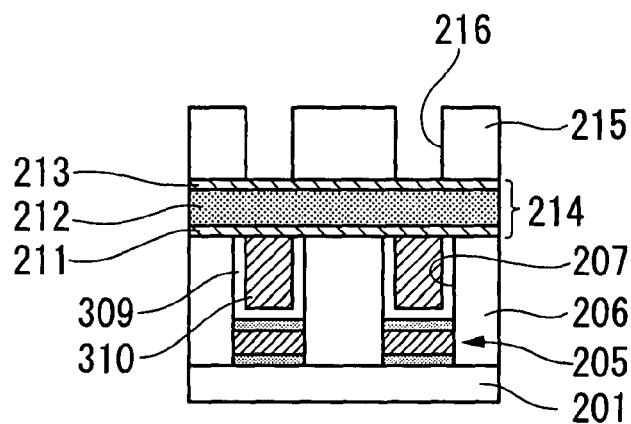

Next, as shown in FIG. 7C, second wires (word lines) 214 comprising three layers, which are P-type semiconductor layers 211, high-melting point metal film 212 of tungsten or similar, and P-type semiconductor layers 213, are formed and patterned similarly to the first embodiment, after which an interlayer dielectric film 215 is formed, and the surface is flattened. Then, contact holes 216 are formed, exposing portions of the second wires 214.

Figure 7D:
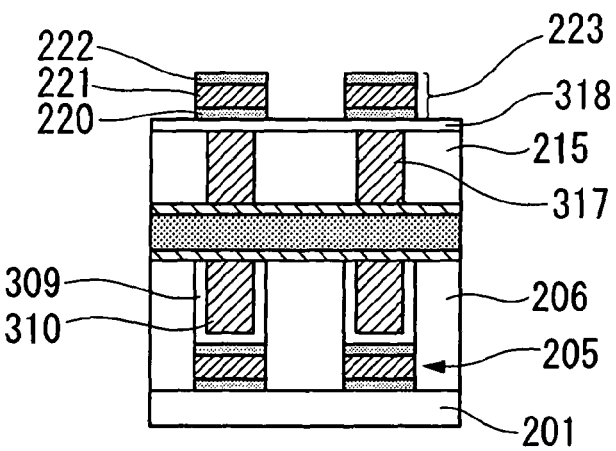

Next, as shown in FIG. 7D, after forming N-type semiconductor layers 317 so as to completely fill the contact holes 207, CMP or another method is used to remove the N-type polysilicon on the surface, so that N-type polysilicon containing phosphorus (N-type impurities) is formed only in the contact holes 207, thereby forming the N-type semiconductor layers 317. Next, the CVD method is used to form a dielectric layer 318 of silicon oxide or similar to a thickness of approximately 3 to 10 nm, to cover the surface at which the N-type semiconductor layers 317 are exposed. Then, similarly to the first embodiment, other first wires (bit lines) 223 are formed and patterned.

Thereafter, these processes are similarly repeated as necessary, to stack memory cells.

The storage elements in the first embodiment have structures in which a dielectric film is interposed between two N-type semiconductor layers provided in contact holes. On the other hand, the storage elements in the present embodiment are simplified, so that there is only one layer each of the N-type semiconductor layers 310 and 317. Hence the configuration of the semiconductor storage device can be simplified, and semiconductor storage devices can be manufactured more inexpensively.

In the above first and second embodiments, storage elements of memory cells are described as configured so as to utilize conduction due to breakdown of a dielectric film. However, in the present invention, combination with other storage elements is also possible. That is, the present invention is characterized by the method of formation of PN junction diodes in each memory cell; application to any storage elements is possible, so long as the storage elements have a function by which the resistance value is changed through application of a voltage or current from outside.

As an example of storage elements having such a function, elements are widely known having a structure in which a perovskite metal oxide, which exhibits colossal electro-resistance (CER) in which the resistance value changes greatly with application of a voltage, are interposed between metal electrodes. An example of application of the present invention to storage elements utilizing the CER phenomenon is explained, referring to the drawings.

Third Embodiment

Figure 8:
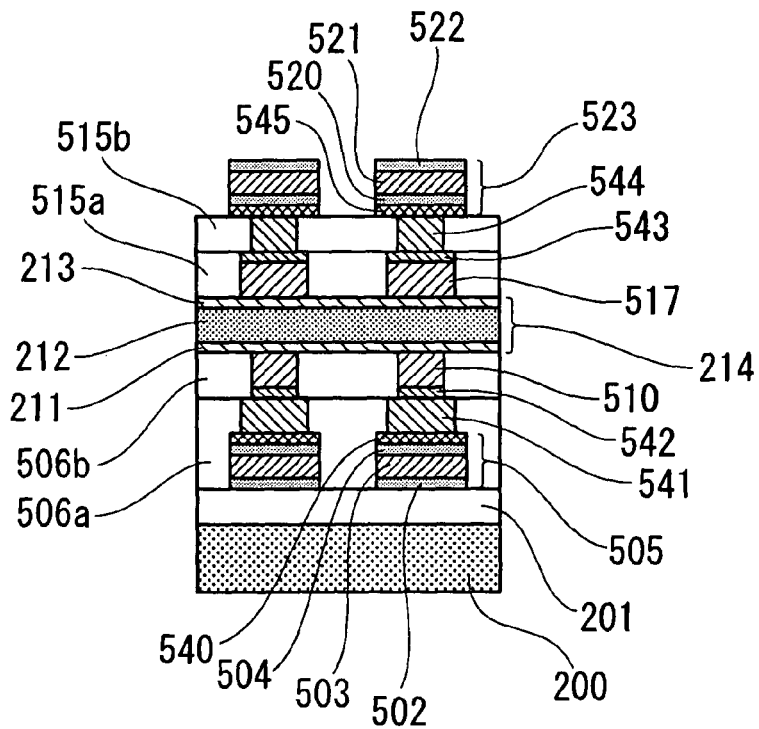
FIG. 8 is a schematic cross-sectional view showing principal portions of the semiconductor storage device in accordance with a third embodiment of the present invention.

As a third embodiment, a semiconductor storage device comprising storage elements which utilize the CER phenomenon is explained, referring to FIG. 8. FIG. 8 is a schematic cross-sectional view showing principal portions of the semiconductor storage device in accordance with the present embodiment. Of the configuration shown in FIG. 8, portions which are the same as in the configurations shown in FIG. 1 through FIG. 5B are assigned the same symbols, and explanations thereof are omitted.

In FIG. 8, a dielectric film 201, formed using a silicon oxide film or similar, is formed on the semiconductor substrate 200. On the dielectric film 201 is formed a laminated film comprising four layers which are a TiN layer 502, a layer 503 of a high-melting point metal such as tungsten, a TiN layer 504, and a Ti (titanium) layer 540; then patterning is performed, to form first wires 505 as bit lines.

An interlayer dielectric film 506a of silicon oxide or similar is formed so as to cover the first wires 505. Contact holes are opened in the interlayer dielectric film 506a, to become regions for formation of storage elements, and layers 541 of $Pr_{0.7}Ca_{0.3}MnO$ (hereafter called a "PCMO layer"), which are a perovskite metal oxide, are formed so as to fill the contact holes; the surface of the PCMO layers 541 and interlayer dielectric film 506a is then flattened by CMP or another method.

An interlayer dielectric layer 506b is formed on the PCMO layers 541 and interlayer dielectric layer 506a. Contact holes are formed in the interlayer dielectric layer 506b so as to expose the surfaces of the PCMO layers 541, and platinum (Pt) film 542 is provided in the bases of these contact holes. On the platinum film 542 are formed N-type semiconductor layers 510 of N-type polysilicon, so as to fill the contact holes. In order to form the platinum film 542 only at the bases of the contact holes, a method of highly directional sputtering in the vertical direction may be used to deposit platinum on the bases of the contact hole and the surface of the interlayer dielectric layer 506b, following which the N-type semiconductor layers 510 are formed so as to fill the contact holes; then the CMP method is used to remove both the N-type semiconductor layers 510 and the platinum film 542 on the surface of the interlayer dielectric layer 506b. The PCMO layers 541 interposed between the platinum film 542 and the titanium film 540 undergoes large changes in resistance value upon application of a voltage from outside, and so can be used as storage elements.

Second wires (word lines) 214, comprising three layers which are a P-type semiconductor layer 211 of P-type polysilicon, a high-melting point metal layer 212 of tungsten or similar, and a P-type semiconductor layer 213 of P-type polysilicon, are formed on the interlayer dielectric layer 506b so as to make contact with the N-type semiconductor layers 510. The second wires 214 are patterned in a direction intersecting the first wires 505. PN junction diodes are formed by the N-type semiconductor layers 510 and the P-type semiconductor layers 211.

An interlayer dielectric layer 515a of silicon oxide or similar is formed on the second wires 214. Contact holes are formed in the interlayer dielectric layer 515a, in regions for formation of storage elements. N-type semiconductor layers 517 and platinum films 543 are formed in these contact holes. The surface of the platinum films 543 is flattened by CMP or another method. Interlayer dielectric films 515b are formed on the platinum films 543. Contact holes are formed in the interlayer dielectric films 515b so as to expose the surface of the platinum films 543, and PCMO layers 544 are formed so as to fill the contact holes. The surface of the PCMO layers 544 is flattened by CMP or another method.

Other first wires (bit lines) 523, comprising a four-layer structure of a titanium layer 545, TiN layer 520, high-melting point metal layer 521 of tungsten or similar, and TiN layer 522, are formed so as to be in contact with the PCMO layers 544. These first wires 523 are patterned so as to be arranged in the same direction as the lower first wires 505. Above these first wires (bit lines) 523, additional layers of memory cells with similar structures can be formed in the necessary quantity.

Perovskite metal oxides exhibiting the CER phenomenon such as that of the PCMO layers 541 and 544 can be made to exhibit reversible changes in resistance value by changing the voltage application method. The structure described in the present embodiment can be used as storage elements in OTP memory.

In the present embodiment, examples are explained of use of PCMO layers 541 and 544 as storage elements; however, other materials exhibiting the CER phenomenon can similarly be used.

Furthermore, a structure employing phase-change materials as storage elements is also possible. Phase-change materials are substances the phase of which can be made to change between a crystalline state and an amorphous state by passing a current to heat the substances; as the phase changes, the electrical resistance value also changes considerably. This phenomenon can be utilized in storage elements.

Fourth Embodiment

Figure 9:
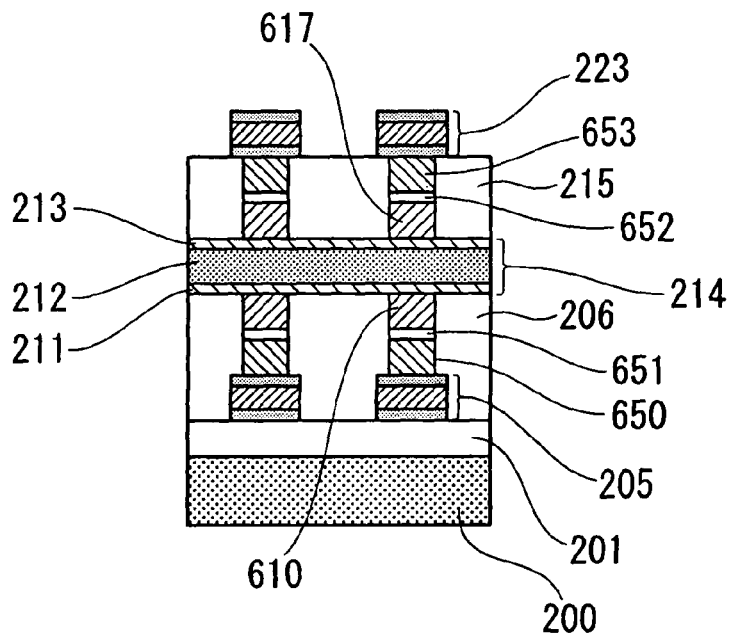
FIG. 9 is a schematic cross-sectional view showing principal portions of the semiconductor storage device in accordance with a fourth embodiment of the present invention.

As a fourth embodiment, a semiconductor storage device comprising storage elements which utilize a phase-change material is explained, referring to FIG. 9. FIG. 9 is a schematic cross-sectional view showing principal portions of the semiconductor storage device in accordance with the present embodiment. Of the configuration shown in FIG. 9, portions which are the same as in the configurations shown in FIG. 1 through FIG. 5B are assigned the same symbols, and explanations thereof are omitted.

In FIG. 9, a dielectric film 201 formed using silicon oxide or similar is formed on a semiconductor substrate 200. First wires 205 with a three-layer structure, similarly to the first embodiment are formed on the dielectric film 201.

An interlayer dielectric layer 206 is formed so as to cover the first wires 205. Contact holes are opened in the interlayer dielectric film 206 in regions for formation of storage elements; and high-melting point metal layers 650 of tungsten or similar, layers 651 comprising the representative phase-change material $Ge_2Sb_2Te_5$ (hereafter called "GST layers"), and N-type semiconductor layers 610, are formed so as to fill the contact holes. The GST layers 651 are interposed between the high-melting point metal layers 650 and the N-type semiconductor layers 610, and function as storage elements through a change in resistance value when the phase changes.

In order to cause a change in the phase state, it is sufficient to pass an appropriate current through the GST layer 651, causing heating and subsequent cooling of the GST layer 651. When judging the state of a storage element, a small current is passed so as not to cause a change in the phase of the GST layer, and the magnitude of the resistance value is judged.

Second wires (word lines) 214, comprising three layers which are P-type semiconductor layers 211, high-melting point metal layers 212, and P-type semiconductor layers 213, are formed on the interlayer dielectric layer 206 so as to be in contact with the N-type semiconductor layers 610. The second wires 214 are patterned in a direction intersecting the first wires 205. PN junction diodes are formed by the N-type semiconductor layers 610 and the P-type semiconductor layers 211.

An interlayer dielectric layer 215 is formed on the second wires 214. Contact holes are formed in the interlayer dielectric layer 215 in regions for formation of storage elements. N-type semiconductor layers 617 of N-type polysilicon, GST layers 652, and high-melting point metal layers 653 are stacked in these contact holes, in order.

Other first wires 223 are formed so as to make contact with the high-melting point metal layers 653. The first wires 223 are patterned so as to extend in the same direction as the lower first wires 205. Above these first wires (bit lines) 223, memory cells with a similar structure can be layered in the number of layers required.

The resistance value of phase-change materials such as that used in the GST layers can be changed reversibly by changing the current-based heating method. A structure such as that described in the present embodiment can be used as storage elements in OTP memory.

In the present embodiment, GST layers 650 and 652 are used as phase-change materials. However, chalcogenide materials, the resistance value of which changes with phase, can also be used. In addition to the above-described $Ge_2Sb_2Te_5$, specific examples include GaSb, InSb, InSe, $Sb_2Te_3$, GeTe, $GeSb_2Te_5$, InSbTe, GaSeTe, $SnSb_2Te_4$, InSbGe, $Se_{20}Sb_{20}Te_{60}$, AgInSbTe, (GeSn)SbTe, GeSb(SeTe), $Te_{81}Ge_{15}Sb_2S_2$, and similar.

As still another embodiment of the present invention, TMR elements having a tunnel magnetoresistance (TMR) effect can be used as storage elements. A TMR element has a structure in which a dielectric film is interposed between two ferromagnetic layers; the electrical resistance value changes greatly when the magnetizations in the two ferromagnetic layers are in the same direction and are in opposite directions. This phenomenon can be utilized in a storage element. In recent years, the principle of spin-injection magnetization reversal has been employed to develop techniques to revert magnetization direction. By appropriately selecting the dielectric film material for use in the TMR element, and by employing a ferromagnetic layer having a multilayer structure comprising different types of materials, the resistance value of a TMR element can be modified by passing a comparatively small current.

Fifth Embodiment

Figure 10:
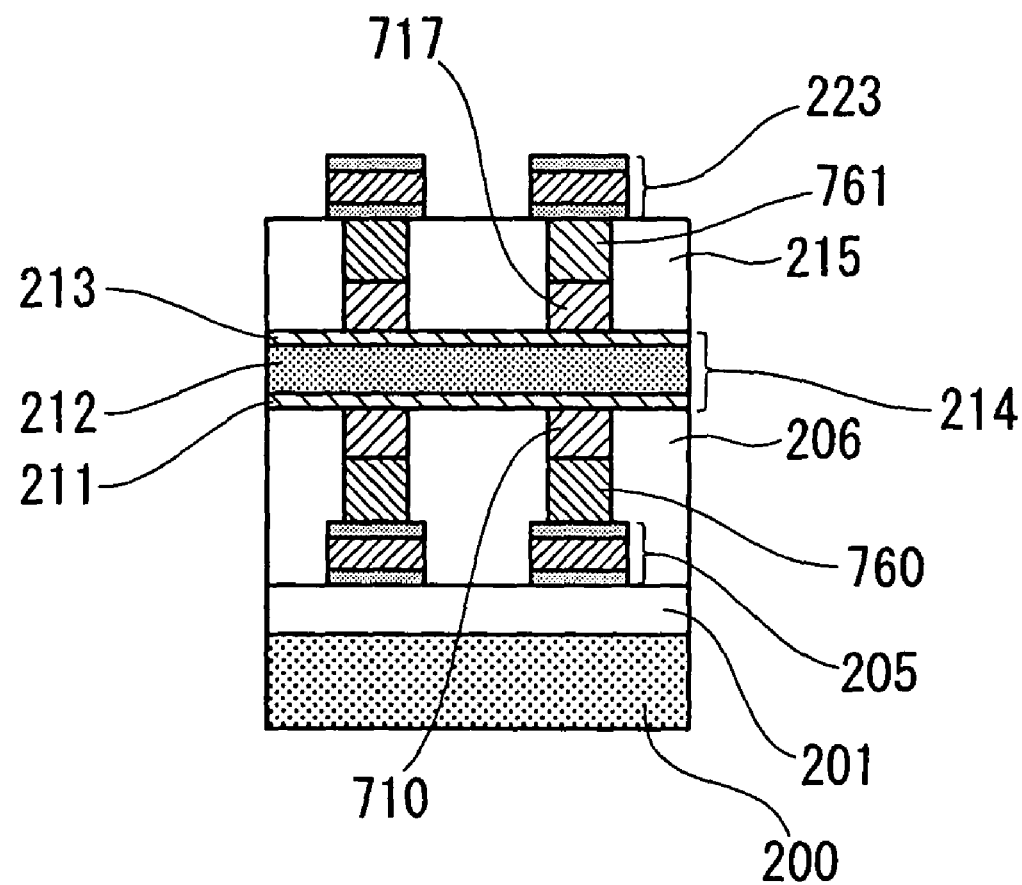
FIG. 10 is a schematic cross-sectional view showing principal portions of the semiconductor storage device in accordance with a fifth embodiment of the present invention.
Figure 11:
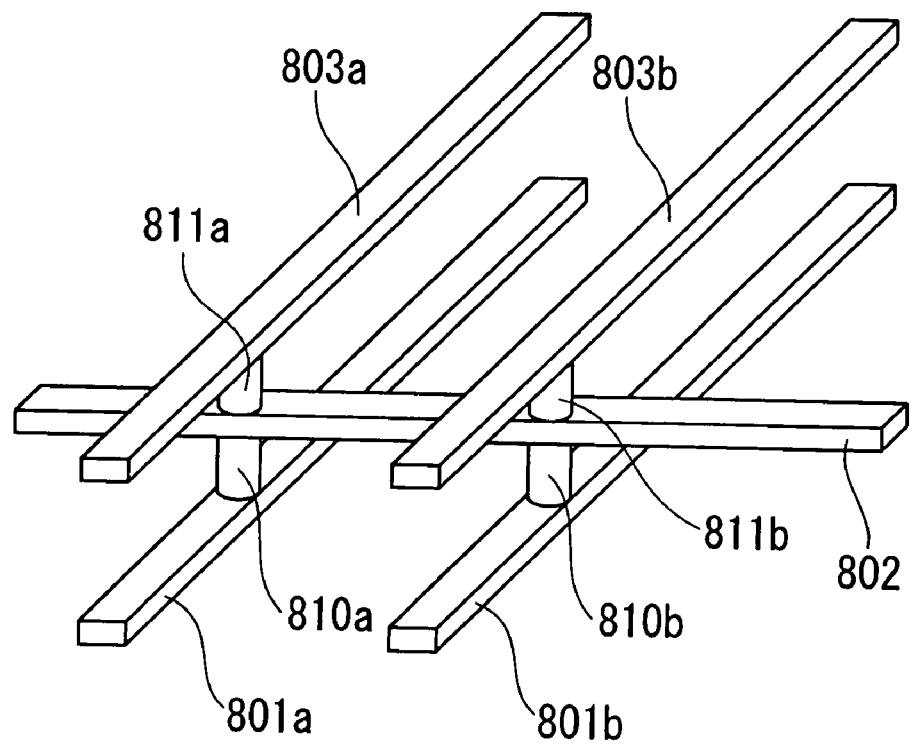
FIG. 11 is a perspective view showing the configuration of a portion of a conventional semiconductor storage device.
Figure 12:
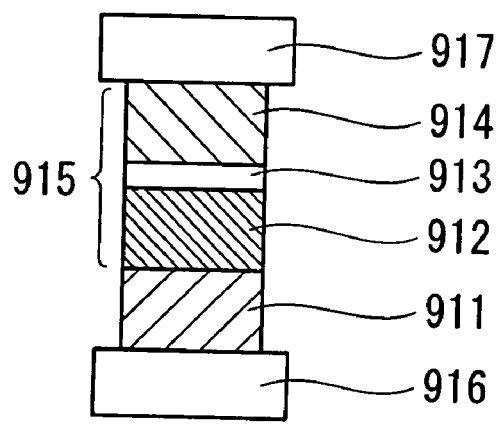
FIG. 12 is a schematic cross-sectional view showing principal portions of a conventional semiconductor storage device.
Figure 13:
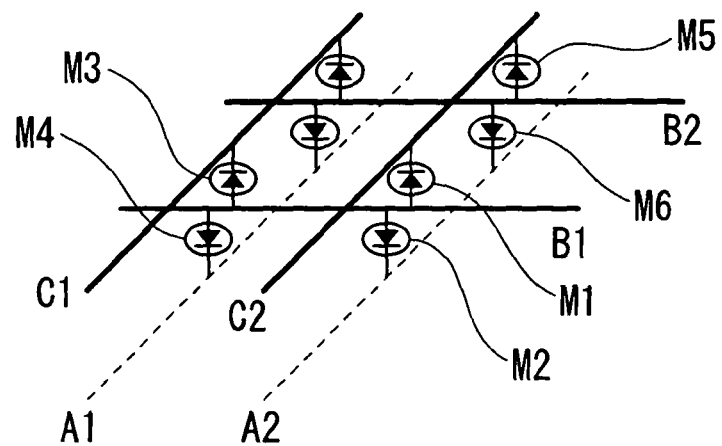
FIG. 13 is a circuit diagram showing the circuit configuration of a conventional semiconductor storage device.
Figure 14A:
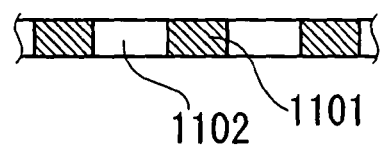
FIGS. 14A-14C are process diagrams explaining a method of manufacture of a conventional semiconductor storage device.
Figure 14B:
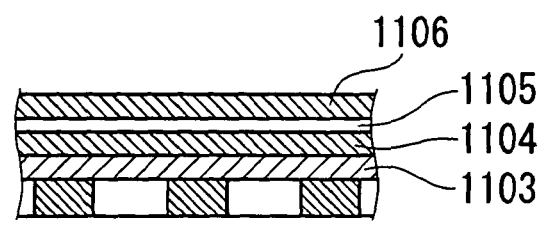
Figure 14C:
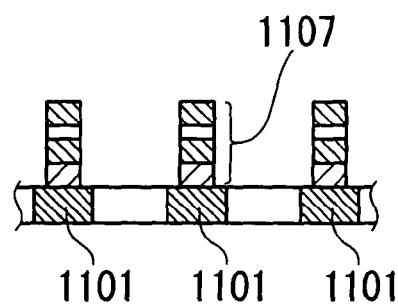

As a fifth embodiment, a semiconductor storage device comprising storage elements formed from TMR elements is explained, referring to FIG. 10. FIG. 10 is a schematic cross-sectional view showing principal portions of the semiconductor storage device in accordance with the present embodiment. Of the configuration shown in FIG. 10, portions which are the same as in the configurations shown in FIG. 1 through FIG. 5B are assigned the same symbols, and explanations thereof are omitted.

In FIG. 10, a dielectric film 201 formed using silicon oxide or similar is formed on a semiconductor substrate 200. Similarly to the first embodiment, first wires 205 with a three-layer structure are formed on the dielectric film 201.

An interlayer dielectric layer 206 is formed so as to cover the first wires 205. Contact holes, which will become the regions for formation of storage elements, are opened in the interlayer dielectric layer 206. TMR elements 760 and N-type semiconductor layers 710 of N-type polysilicon are formed, in order, so as to fill these contact holes.

The basic structure of the TMR elements 760 is a tunnel element in which a dielectric film layer is interposed between a magnetic layer the magnetization direction of which can be changed (magnetization free layer), and a magnetization layer the magnetization direction of which is fixed (magnetization pinned layer).

As material of the magnetization free layer, iron (Fe), cobalt (Co), nickel (Ni), and alloys containing these, can be used. In addition to magnetic layers comprising a single material, laminated structure of a plurality of magnetic materials, such as CoFe and NiFe, can also be used. As the dielectric film layer, magnesium oxide (MgO) and aluminum oxide (AlO) can be used. As the material of the magnetization pinned layers, iron, cobalt, nickel, and alloys containing these can be used. As the magnetization pinned layer, in addition to magnetic layers comprising a single material, a laminated structure of a plurality of ferromagnetic materials, layered to interpose a nonmagnetic material (ruthenium or similar) in a ferrimagnetic structure, can also be used.

The direction of magnetization of the magnetization free layer can be inverted by applying a current from outside. Since the resistance value of the TMR element 760 changes depending on the relation to the magnetization direction in the magnetization pinned layer, the element functions as a storage element. In order to judge the storage state using the resistance value of the TMR element 760, a voltage can be applied such that a minute current flows, of magnitude such that the magnetization of the magnetization free layer is not inverted, and the magnitude of this current can be determined.

Second wires (word lines) 214, comprising three layers which are P-type semiconductor layers 211, high-melting point metal layers 212, and P-type semiconductor layers 213, are formed on the interlayer dielectric layer 206 so as to make contact with the N-type semiconductor layers 710. The second wires 214 are patterned in a direction intersecting the first wires 205. PN junction diodes are formed by the N-type semiconductor layers 710 and the P-type semiconductor layers 211.

An interlayer dielectric layer 215 is formed on the second wires 214. Contact holes are provided in the interlayer dielectric layer 215, in regions for formation of storage elements. N-type semiconductor layers 717 of N-type polysilicon, and TMR elements 761 are formed in the contact holes, in order. The TMR elements 761 are configured similarly to the previously described TMR elements 760.

Other first wires 223 are formed so as to be in contact with the TMR elements 761. The first wires 223 are patterned so as to extend in the same direction as the lower first wires 205. Above these first wires (bit lines) 223, memory cells with a similar structure can be layered in the number of layers required.

By employing TMR elements with the structure described in the present embodiment, in which the magnetization direction can be inverted by changing the manner of passing a current, so that the resistance value can be changed reversibly, the TMR elements can be used as storage elements in OTP memory.

In addition to the above-described third through fifth embodiments, by applying a voltage or current stress to storage element portions using electrical signals from outside, electrical resistance values can be changed, and if the resistance value is retained even after the externally applied stress is removed, then the element can be used as a storage element of the present invention.

Furthermore, memory cells formed so as to make contact above and below a single second wire (word line) need not necessarily have the same cross-sectional shape (and need not be axially symmetric about the word line). That is, as shown in FIG. 6 and FIG. 8, even when the shapes of memory cells differ above and below a word line, because data is not stored using the absolute values of resistance values of the memory cells, but the stored contents of data is judged through the resistance magnitude, so that the memory cell resistance values need not be uniformly the same, and a degree of differences in values can be tolerated. Hence there is no problem with differences in memory cell shapes, so long as the differences in resistance values are within a tolerance range.

While preferred embodiments of the present invention have been described and illustrated above, it should be understood that these are exemplary of the present invention and are not to be considered as limiting. Additions, omissions, substitutions, and other modifications can be made without departing from the gist or scope of the present invention. Accordingly, the present invention is not to be considered as being limited by the foregoing description, and is only limited by the scope of the appended claims.

What is claimed is:

1. A semiconductor storage device comprising:
   a first wire which extends in one direction;
   a second wire which extends in a direction intersecting the first wire;
   an interlayer dielectric film formed between the second wire and the first wire; and
   a memory cell which is positioned at a portion of intersection of the first wire with the second wire between the first wire and the second wire, the memory cell comprising a storage element which is formed in a contact hole in the interlayer dielectric film and includes an end which forms a part of a PN junction diode,
   wherein the second wire is used in selecting the memory cell and includes a P-type semiconductor that is formed on the interlayer dielectric film and outside of the contact hole and forms a part of the PN junction diode, and
   wherein a plurality of structures, each structure comprising the first wire, the second wire, and the memory cell, are provided three-dimensionally.

2. The semiconductor storage device as recited in claim 1, wherein the second wire is a laminated structure of a conducting layer and a P-type semiconductor layer, the P-type semiconductor layer extending in the same direction in which the conducting layer extends, and the P-type semiconductor layer forms a part of the PN junction diode.

3. The semiconductor storage device as recited in claim 2, wherein the
   contact hole is provided at the portion of intersection in the interlayer dielectric film, and
   wherein the storage element comprises an N-type semiconductor layer in contact with the P-type semiconductor layer of the second wire and formed in the contact hole, and the PN junction diode is formed by the P-type semiconductor layer and the N-type semiconductor layer.

4. The semiconductor storage device as recited in claim 1, wherein the storage element is an element the resistance value of which is changed by an electrical signal.

5. The semiconductor storage device as recited in claim 4, wherein the storage element has an insulating material the electrical resistance of which is changed by dielectric breakdown.

6. The semiconductor storage device as recited in claim 4, wherein the storage element is a material which exhibits a colossal electro-resistance phenomenon.

7. The semiconductor storage device as recited in claim 6, wherein the material exhibiting the colossal electro-resistance phenomenon is a perovskite metal oxide.

8. The semiconductor storage device as recited in claim 4, wherein the storage element is a phase-change material which undergoes a phase change upon heating using a current.

9. The semiconductor storage device as recited in claim 4, wherein the storage element is a tunnel magnetoresistance effect element.

10. The semiconductor storage device as recited in claim 1, wherein the storage element is connected to the first wire.

11. The semiconductor storage device as recited in claim 1, wherein the first wire is a bit line, and the second wire is a word line.

12. The semiconductor storage device as recited in claim 1, wherein the first wire and the second wire comprise a high-melting point metal layer.

13. The semiconductor storage device as recited in claim 3, wherein the P-type semiconductor layer comprises a polysilicon layer in which a P-type impurity is diffused, and the N-type semiconductor layer comprises a polysilicon layer in which an N-type impurity is diffused.

14. The semiconductor storage device as recited in claim 4, wherein a connection portion between the first wire and the memory cell comprises an N-type silicon plug.

15. The semiconductor storage device as recited in claim 4, further comprising:
    another first wire which is positioned on the side of the second wire opposite from the first wire and extends in the same direction as the first wire;
    another interlayer dielectric film which is provided between the second wire and the other first wire; and
    another memory cell which is provided at a portion of intersection of the second wire with the other first wire,
    wherein a connection portion of the memory cell with the first wire, and a connection portion of the memory cell with the other first wire, are formed from N-type silicon plugs.

16. The semiconductor storage device as recited in claim 3, wherein the storage element of the memory cell comprises an insulating material the electrical resistance of which is changed by dielectric breakdown, a side face and a bottom face of the contact hole are covered by the insulating material, and the N-type semiconductor layer is buried by the insulating material.

17. The semiconductor storage device as recited in claim 15, wherein a storage element of the other memory cell comprises an insulating material the electrical resistance of which is changed by dielectric breakdown, and the insulating material is formed in a film and is layered on a surface of the other interlayer dielectric film on the side of the other first wire.

18. The semiconductor storage device as recited in claim 15, wherein a cross-sectional shape of the memory cell is different from a cross-sectional shape of the other memory cell.

19. The semiconductor storage device as recited in claim 15, wherein a cross-sectional shape of the memory cell and a cross-sectional shape of the other memory cell are axially symmetric about the second wire.

20. A method of manufacture of a semiconductor storage device, the method comprising:
    forming a first wire;
    forming an interlayer dielectric film covering the first wire;
    providing a contact hole in the interlayer dielectric film, exposing a portion of the first wire;
    forming a storage element including an N-type semiconductor layer in the contact hole;
    forming a P-type semiconductor film outside of the contact hole and covering the N-type semiconductor layer and the interlayer dielectric film;
    forming a conductive film on the P-type semiconductor film; and
    patterning the P-type semiconductor film and the conductive film, and forming a second wire intersecting the first wire at the contact hole.

21. The method as recited in claim 20, further comprising:
    forming a P-type semiconductor film on the conductive film.

22. The method as recited in claim 20, wherein the P-type semiconductor film is formed by using a CVD method to form a polysilicon film, and performing ion implantation of a P-type impurity into the polysilicon film.

23. The method as recited in claim 20, wherein, after forming the N-type semiconductor layer, the N-type semiconductor layer and the interlayer dielectric film are flattened.

24. The method as recited in claim 20, wherein the forming of the storage element comprises forming an insulating material.

25. The semiconductor storage device as recited in claim 1, wherein the storage element comprises a pillar-shaped storage element including a first N-type semiconductor layer formed in the contact hole and on the first wire, a dielectric layer formed in the contact hole and on the first N-type semiconductor layer, and a second N-type semiconductor layer formed in the contact hole and on the dielectric film and having a surface which is co-planar with a surface of the interlayer dielectric film.

26. The semiconductor storage device as recited in claim 25, wherein the P-type semiconductor of the second wire is formed on the surface of the interlayer dielectric film and on the surface of the second N-type semiconductor layer.

* * * * *